(12) United States Patent
Arvelo et al.

(10) Patent No.: US 8,385,067 B2
(45) Date of Patent: Feb. 26, 2013

(54) IN-LINE MEMORY AND CIRCUIT BOARD COOLING SYSTEM

(75) Inventors: Amilcar Arvelo, Poughkeepsie, NY (US); Jason R. Eagle, Kasson, MN (US); Eric A. Eckberg, Rochester, MN (US); Gary F. Goth, Pleasant Valley, NY (US); Katie L. Pizzolato, Austin, TX (US); Scott A. Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 12/944,680

(22) Filed: Nov. 11, 2010

(65) Prior Publication Data

US 2012/0120605 A1 May 17, 2012

(51) Int. Cl.
*H05K 7/20* (2006.01)
*F28F 7/00* (2006.01)
*H01L 23/34* (2006.01)

(52) U.S. Cl. ... 361/699; 361/702; 361/715; 361/679.52; 361/679.53; 165/80.4; 165/104.33; 257/715; 174/15.2

(58) Field of Classification Search ............... 361/699, 361/700, 702, 715, 679.52, 679.53; 165/80.3–80.4, 165/104.33; 257/714–715; 174/15.1–15.2
See application file for complete search history.

(56) References Cited

U.S. PATENT DOCUMENTS

| 4,315,300 | A | * | 2/1982 | Parmerlee et al. ............ 361/703 |
| 6,060,248 | A | * | 5/2000 | Lane et al. .................... 435/6.12 |
| 7,151,668 | B1 | | 12/2006 | Stathakis ....................... 361/700 |
| 7,242,579 | B2 | | 7/2007 | Fernandez et al. ........ 361/679.48 |
| 7,372,702 | B2 | | 5/2008 | Gauche et al. ................. 361/719 |
| 7,460,367 | B2 | * | 12/2008 | Tracewell et al. ........ 361/679.48 |
| 7,518,871 | B2 | | 4/2009 | Campbell et al. .............. 361/702 |
| 7,639,498 | B2 | | 12/2009 | Campbell et al. .............. 361/699 |
| 7,641,101 | B2 | | 1/2010 | Campbell et al. .............. 228/183 |
| 8,004,841 | B2 | * | 8/2011 | Cipolla et al. ................. 361/699 |
| 8,027,162 | B2 | * | 9/2011 | Campbell et al. .............. 361/699 |
| 8,125,780 | B2 | * | 2/2012 | Goth et al. ..................... 361/699 |
| 2008/0062652 | A1 | | 3/2008 | Lieberman et al. ............ 361/715 |
| 2008/0212282 | A1 | | 9/2008 | Hall et al. ...................... 361/701 |
| 2009/0316366 | A1 | | 12/2009 | Mullen et al. .................. 361/717 |
| 2010/0025010 | A1 | | 2/2010 | Cipolla et al. ................... 165/47 |
| 2010/0085712 | A1 | | 4/2010 | Hrehor et al. .................. 361/699 |

FOREIGN PATENT DOCUMENTS

WO    WO 2008082042    7/2008

OTHER PUBLICATIONS

IBM, "DIMM Array Liquid Cooling Structure With FRU-ability Features", IPCOM000168297D, pp. 1-3 (Mar. 5, 2008).
"Method for attaching heatpipes across multiple heatsinks on a memory module", IPCOM000146639D, pp. 1-3 (Feb. 19, 2007).

* cited by examiner

*Primary Examiner* — Zachary M Pape

(74) *Attorney, Agent, or Firm* — Dennis Jung; Ido Tuchman

(57) ABSTRACT

A system to remove heat from an in-line memory module and/or circuit board may include a cold-rail to engage each end of an in-line memory module adjacent to where the in-line memory module is attachable to a circuit board, the cold-rail to remove heat from the in-line memory module. The system may also include a cold-plate connected to the cold-rail with the circuit board between the cold-plate and the cold-rail, the cold-plate to remove heat from the circuit board.

24 Claims, 7 Drawing Sheets

IN-LINE MEMORY AND CIRCUIT BOARD COOLING SYSTEM

STATEMENT REGARDING FEDERALLY SPONSORED RESEARCH OR DEVELOPMENT

This invention was made with Government support under Contract No. HR0011-07-9-0002, awarded by the Defense Advanced Research Projects Agency (DARPA). The Government has certain rights in this invention.

BACKGROUND

1. Field of the Invention

The invention relates to the field of computer systems, and, more particularly, to a system to cool an in-line memory module and/or circuit board.

2. Description of Background

Generally, an in-line memory module is a printed circuit board that may carry random access memory ("RAM"), application-specific integrated circuits ("ASIC"), surface mount components ("SMC"), electrical contacts, and/or the like. The in-line memory module usually plugs into another printed circuit board carrying additional electronic components.

A heat spreader and/or heat pipe is a component that may efficiently transfer heat from one area to another area. The heat spreader and/or heat pipe usually has high thermal conductivity.

SUMMARY

According to one embodiment of the invention, a system to remove heat from an in-line memory module and/or circuit board may include a cold-rail to engage each end of an in-line memory module adjacent to where the in-line memory module is attachable to a circuit board, the cold-rail to remove heat from the in-line memory module. The system may also include a cold-plate connected to the cold-rail with the circuit board between the cold-plate and the cold-rail, the cold-plate to remove heat from the circuit board.

The cold-rail and cold-plate each may each, or in combination, comprise an enclosed fluid pathway. The cold-rail is attachable to the circuit board to aid in removing heat from the circuit board.

One side of the cold-rail may connect to a supply manifold, another side of the cold-rail may connect to one side of the cold-plate, and another side of the cold-plate may connect to a return manifold. The system may additionally include cross-over tubing between the one side of the cold-rail that connects to the supply manifold and the other side of the cold-rail that connects to the cold-plate to improve heat transfer out of the in-line memory module.

The system may also include thermal interface material adjoining at least one of the cold-plate and components carried by the circuit board, and the cold-rail and the circuit board. The in-line memory module may comprise a plurality of in-line memory modules that are too closely positioned for any intervening cold-rail or cold-plate to fit in between any two adjacent in-line memory modules. Further, the in-line memory module may have no space opposite the side that is attachable to the circuit board for any intervening cold-rail or cold-plate to be installed.

The cold-rail may engage each end of the in-line memory module with a removable fastener. The cold-plate may act as a circuit board stiffener.

In an embodiment, the system may include a cold-rail to engage each end of an in-line memory module adjacent where the in-line memory module is attachable to a circuit board, the cold-rail to remove heat from the in-line memory module, and the cold-rail engages each end of the in-line memory module with a removable fastener. The system may also include a cold-plate connected to the cold-rail with the circuit board between the cold-plate and the cold-rail, the cold-plate to remove heat from the circuit board, and the cold-plate acts as a circuit board stiffener.

In an embodiment, the system may include a cold-rail to engage each end of an in-line memory module adjacent where the in-line memory module is attachable to a circuit board, the cold-rail to remove heat from the in-line memory module, and the cold-rail comprises an enclosed fluid pathway. The system may also include a cold-plate connected to the cold-rail with the circuit board between the cold-plate and the cold-rail, the cold-plate to remove heat from the circuit board, and the cold-plate comprises an enclosed fluid pathway. The system may further include one side of the cold-rail that connects to a supply manifold, another side of the cold-rail that connects to one side of the cold-plate, and another side of the cold-plate that connects to a return manifold.

The cold-rail may include an aluminum body relieved symmetrically on each side of the cold-rail to accept copper water tube and allow screw thermal-mechanical attachment to the circuit board and to in-line memory module spreaders.

The cold-plate may include a roughened finish to provide thermal interface material stability and durability during field use between the cold-plate and Voltage Transformer Modules.

The in-line memory module may include aluminized Indium thermal interface material mechanically retained by the in-line memory module spreader prior to being plugged into the aluminum side faces of the cold-rail to prevent sticking after long use in field.

The in-line memory module may provide thermal and mechanical engagement of the in-line memory module and thermal interface material to each respective cold-rail is validated by an in-line memory module thermal sensor readout during powering on of a server when the in-line memory module power levels are still low.

DETAILED DESCRIPTION

The invention will now be described more fully hereinafter with reference to the accompanying drawings, in which preferred embodiments of the invention are shown. Like numbers refer to like elements throughout, like numbers with letter suffixes are used to identify similar parts in a single embodiment, and letter suffix lower case n is a variable that indicates an unlimited number of similar elements.

Figure 1:
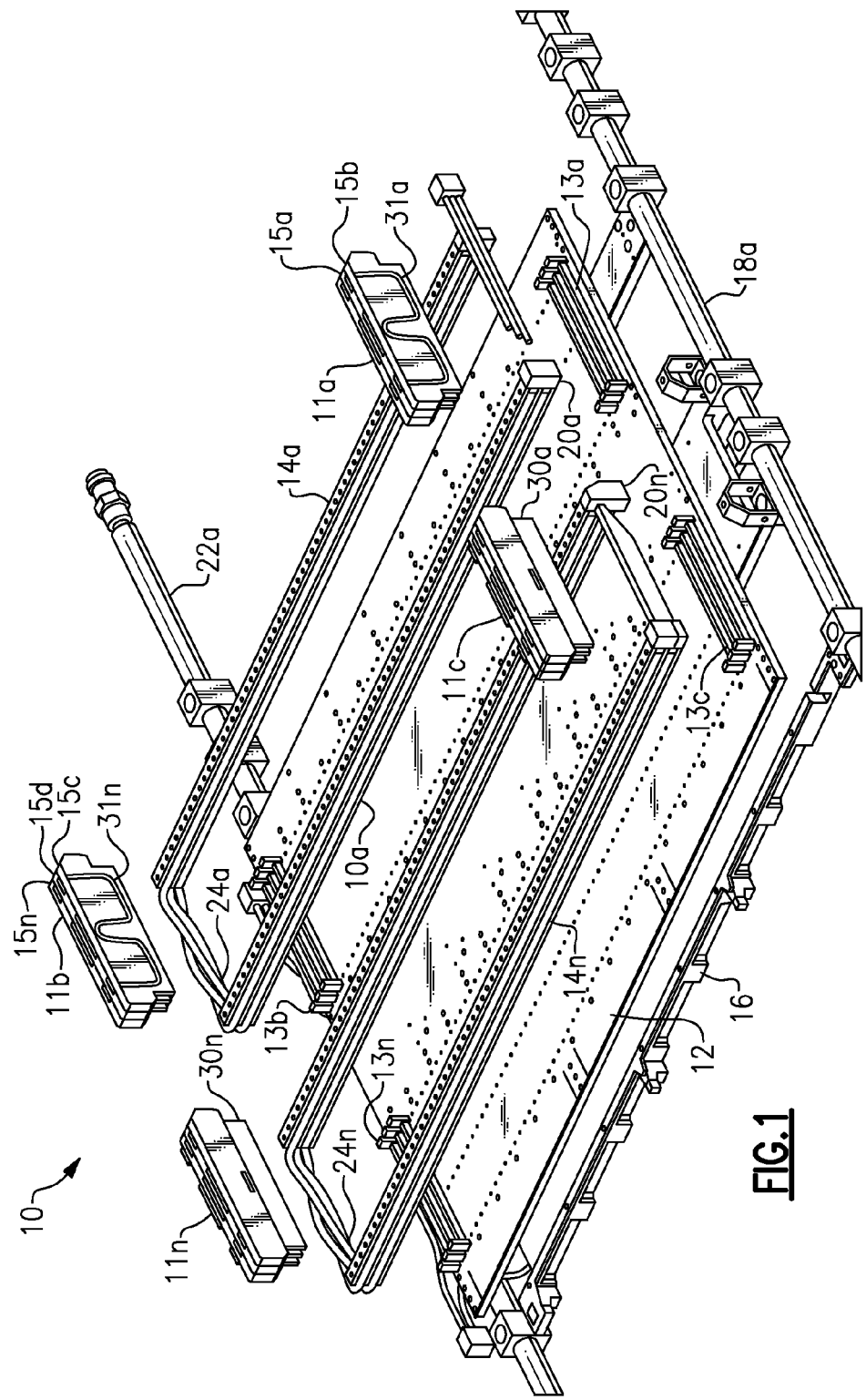
FIG. 1 is a top-view of a system to cool an in-line memory module and/or circuit board in accordance with the invention.
Figure 2:
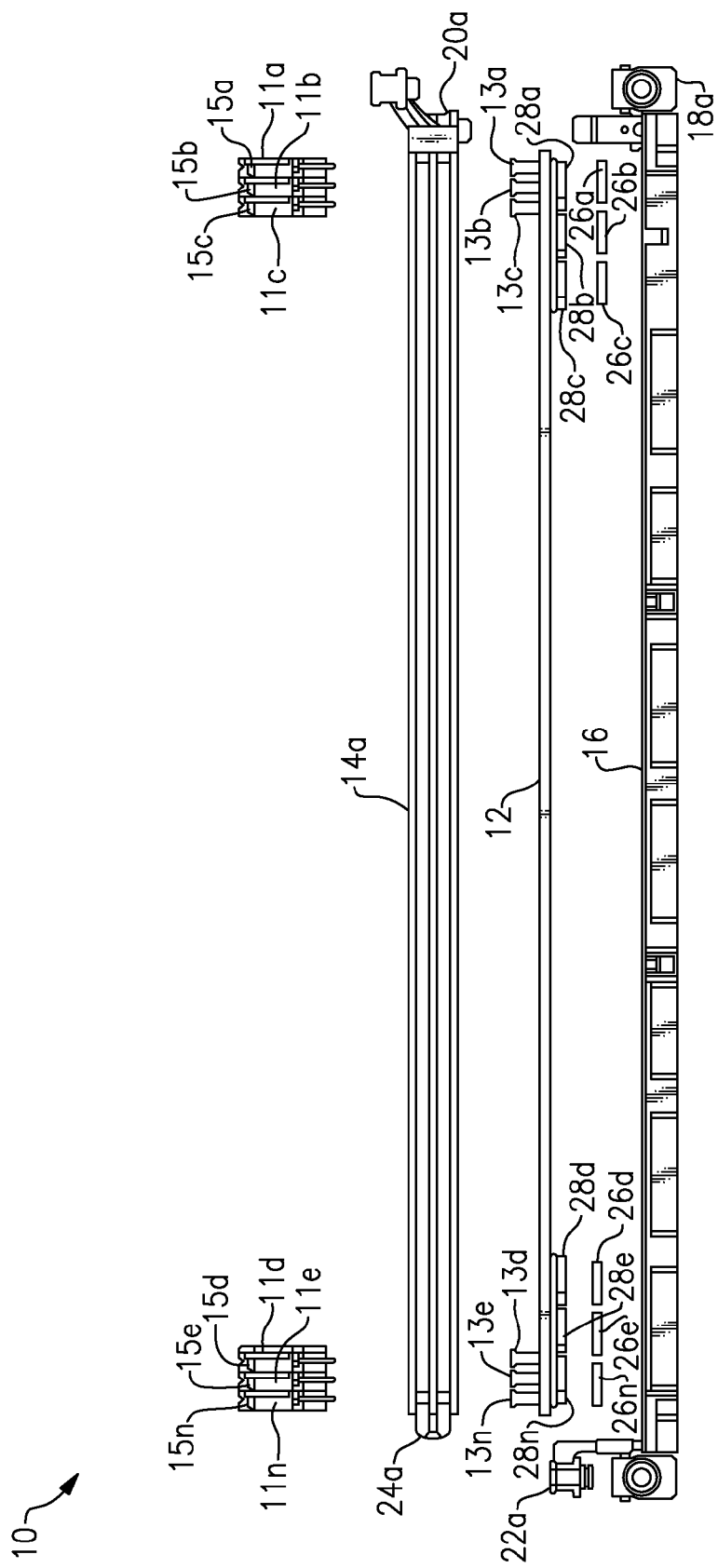
FIG. 2 is a side-view of the system of FIG. 1.

With reference now to FIGS. 1 and 2, a system 10 to remove heat from an in-line memory module 11a-11n, e.g. dual in-line memory module ("DIMM"), and/or circuit board 12 is initially described. In an embodiment, the system 10 includes a cold-rail 14a-14n to engage each end of an in-line memory module 11a-11n adjacent to where the in-line memory module is attachable at in-line memory connectors 13a-13n to a circuit board 12, the cold-rail 14a-14n removes heat from the in-line memory module 11a-11n. The system 10 may also include a cold-plate 16 connected to the cold-rail 14a-14n with the circuit board 12 between the cold-plate and the cold-rail. The cold-plate is configured to remove heat from the circuit board. The cold-plate 16 is shown in more detail at FIG. 7.

In an embodiment, the cold-rail 14a-14n and cold-plate 16 each, or in combination, comprise an enclosed fluid pathway. In another embodiment, the cold-rail 14a-14n is attachable to the circuit board 12 to aid in removing heat from the circuit board.

In a particular configuration, one side of the cold-rail 14a-14n is connected to a respective supply manifold 18a-18n, another side of the cold-rail 14a-14n is connected to one side of the cold-plate 16 at outlets 20a-20n, and another side of the cold-plate 16 is connected to a return manifold 22a-22n. The system 10 may additionally include cross-over tubing 24a-24n between the one side of the cold-rail 14a-14n that connects to the supply manifold 18a-18n and the other side of the cold-rail that connects to the cold-plate 16 thereby improving heat transfer out of the in-line memory 11a-11n.

In an embodiment, system 10 includes thermal interface material 26a-26n adjoining the cold-plate 16 and components 28a-28n (e.g., electronic components carried by the circuit board 12), the cold-rail 14a-14n, and/or the circuit board 12. In some embodiments the in-line memory module 11a-11n comprises a plurality of in-line memory modules that are too closely positioned for any intervening cold-rail 14a-14n or cold-plate 16 to fit in between any two adjacent in-line memory modules. Further, the in-line memory module 11a-11n has no space opposite the side that is attachable to the circuit board 12 for any intervening cold-rail 14a-14n or cold-plate 16 to be installed.

In an embodiment, the cold-rails 14a-14n engage each end of the in-line memory module 11a-11n with a removable fastener 15a-15n. Furthermore, the cold-plate 16 may act as a circuit board 12 stiffener.

In an embodiment, system 10 includes a cold-rail 14a-14n to engage each end of an in-line memory module 11a-11n adjacent where the in-line memory module is attachable to a circuit board 12, such that the cold-rail removes heat from the in-line memory module. The cold-rail may engage each end of the in-line memory module with a removable fastener 15a-15n. The system 10 may also include a cold-plate 16 connected to the cold-rail 14a-14n with the circuit board 12 between the cold-plate and the cold-rail. As discussed above, the cold-plate is configured to remove heat from the circuit board, and the cold-plate acts as a circuit board stiffener.

In an embodiment, system 10 includes a cold-rail 14a-14n to engage each end of an in-line memory module 11a-11n adjacent where the in-line memory module is attachable to a circuit board 12, the cold-rail to remove heat from the in-line memory module, and the cold-rail comprises an enclosed fluid pathway. The system 10 also includes a cold-plate 16 connected to the cold-rail 14a-14n with the circuit board 12 between the cold-plate and the cold-rail, the cold-plate to remove heat from the circuit board, and the cold-plate comprises an enclosed fluid pathway. The system 10 further includes one side of the cold-rail 14a-14n that connects to a supply manifold 18a-18n, another side of the cold-rail that connects to one side of the cold-plate 16, and another side of the cold-plate that connects to a return manifold 22a-22n.

In view of the foregoing, the system 10 aids in cooling an in-line memory module 11a-11n and/or circuit board 12. As a result, the system 10 removes heat from an in-line memory module 11a-11n, e.g., high performance DIMMs, where the packaging density prohibits air cooling and inadequate space between or above the memory DIMMs for cold-plates as well as removes heat from the printed circuit board 12 that is unable to be air cooled.

In one embodiment, the system 10 includes two cold-rails 14a-14n that efficiently remove heat from the ends of in-line memory module 11a-11n conduction packages. The cold-rails 14a-14n reduce temperature variations from water heating effects between in-line memory module 11a-11n sites and enable extreme in-line memory module package density. In addition, the cold-rails 14a-14n remove IIR heat generated in the printed circuit board 12 that the in-line memory modules 11a-11n are plugged into.

For example, an in-line memory module 11a-11n, e.g., high performance DIMM package, can be designed to effectively move its heat to each end of the DIMM by conduction assisted with heat pipe 31a-31n technology. The system 10 provides optimized design concepts for cold-rails 14a-14n at the ends of these in-line memory modules 11a-11n for heat removal to water or other liquid coolant.

System 10 may use machined and brazed copper construction, and/or using rectangular aluminum rails with embedded copper tubes, for instance. While the copper cold-rails 14a-14n provide improved thermal performance, the aluminum solution offers weight, cost, and reduced risk of braze joints leaking. The system 10 provides highly uniform cooling between in-line memory modules 11a-11n sites.

Another feature of the cold-rails 14a-14n is that they can cool the in-line memory modules 11a-11n and use their other thermal surface to cool the printed circuit board 12 that the DIMMs, processors, and other electronics are mounted on. A suitable electrical insulator yet thermal conductor, e.g., thermal interface material (TIM), is placed between the cold-rails 14a-14n and printed circuit board 12.

Another feature of the system 10 is it enables effective field servicing of individual in-line memory modules 11a-11n for either repair or upgrade. This is achieved via a screwed connection, e.g., fasteners 15a-15n, between in-line memory module 11a-11n package and the top thermal surface of cold-rails 14a-14n with an aluminized Indium interface material to ensure the TIM stays with the in-line memory module 11a-11n.

Figure 8:
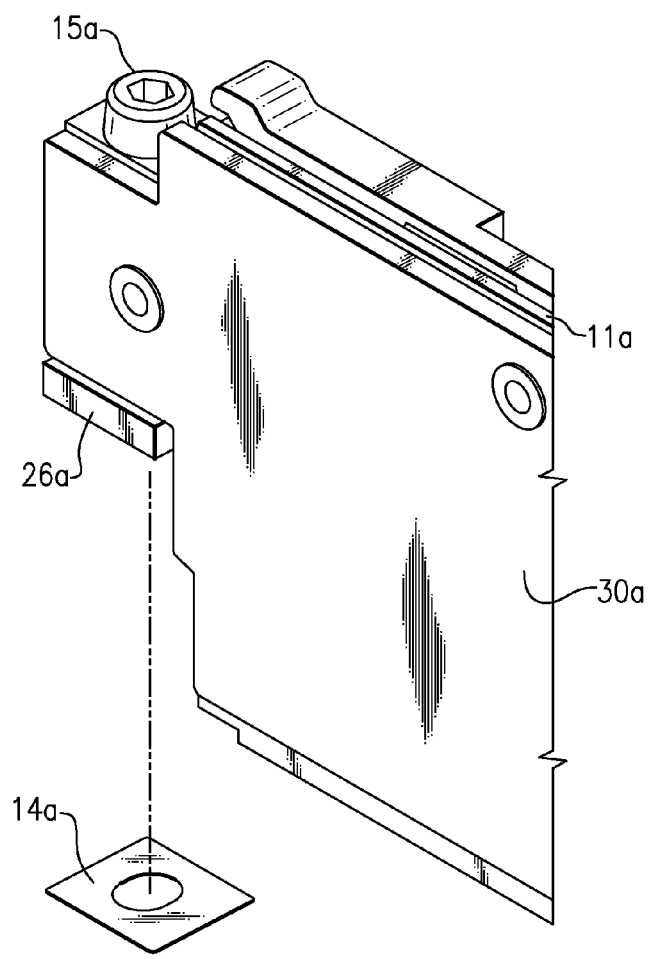
FIG. 8 illustrates an example arrangement of a thermal interface material at an in-line memory module spreader in accordance with the invention.

FIG. 8 illustrates an example arrangement wherein the mechanical features in thermal interface material 26a of DIMM spreader 30a and pressure are used to keep the Indium with the DIMM 11a while handling. In this embodiment, the aluminum (non-sticking) side of the TIM 26a is facing down to cold-rail 14a such that any sticking causes further adherence to DIMM 11a and not to the cold-rail 14a. With the TIMs in place and the DIMMs attached, the height of the cold-rails for DIMM cooling is such that the DIMM power and signal connectors are properly engaged to board connector.

Figure 3A:
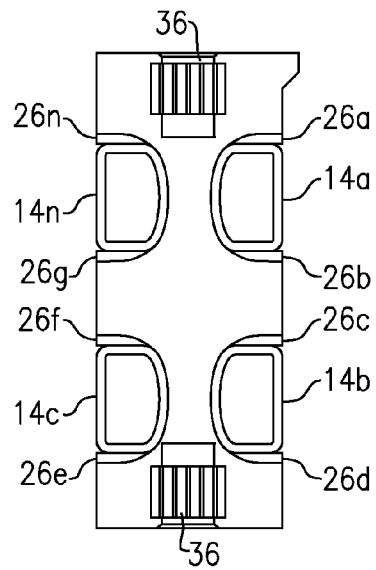
FIGS. 3A and 3B shows screw holes with inserts for attaching the in-line memory modules from one side and attaching to the circuit board assembly from the other side.
Figure 3B:
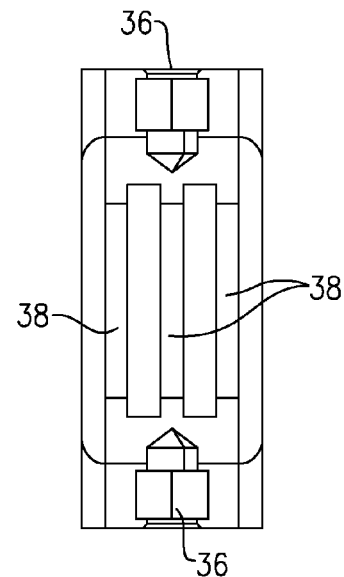

FIGS. 3A and 3B show screw holes with threads or threaded inserts 36 for attaching the in-line memory modules 11a-11n from one side and attachment to printed circuit board 12 assembly from other side. When coupled with a patterned Indium or other suitable dry interface on the DIMM 11a-11n side and an electrical isolator, thermal conductor on the board side 12, heat removal from both sides of cold-rail 14a-14n is achieved. In one embodiment, the system 10 includes water flow channels 38, and the copper tubes 14a-14n are adjacent thermal interface material (TIM) 26a-26n.

Figure 4:
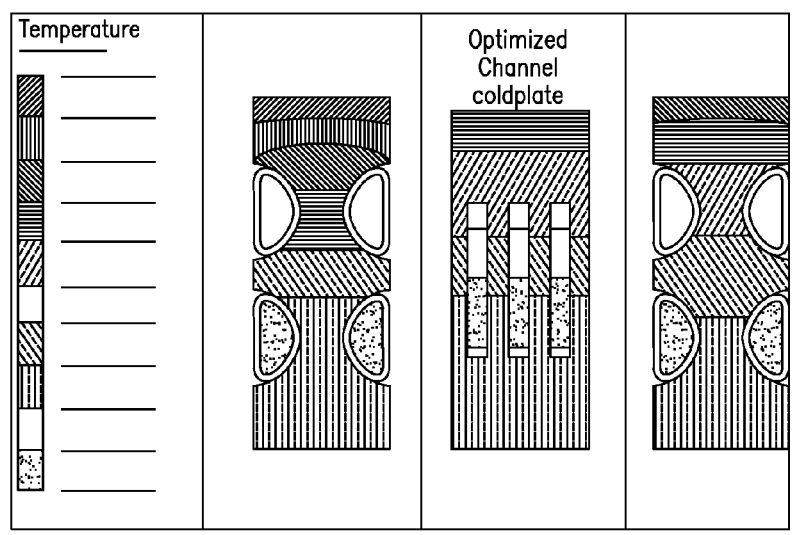
FIG. 4 is a diagram of comparative cold-rail technology temperatures for the case of 60 upstream in-line memory modules each generating 50 watts conducted to the cold-rails.

Turning now to FIG. 4, the comparative coldrail technology temperatures for the case of 60 upstream in-line memory modules each generating 50 watts conducted to the cold-rails are shown. The first two cross-sections of the two cold-rails 14a-14n are shown along with comparable thermal performance at a midpoint location in a 64 DIMM 11a-11n assembly cooled by one set of cold-rails. The leftmost cross-section shows the temperatures in the aluminum rail and copper tube design, with the colder water running down the four tubes. In this model, heat flux from the board side 12 (bottom) thermal surface is not included. The second cross section shows the machined and brazed copper cold-rails 14a-14n temperatures, which have the highest thermal performance. The third cross-section is the same design as the first one but the aluminum material is replaced with copper.

One goal of in-line memory module 11a-11n cooling is to make each DIMM site have as equal of cooling/temperatures as possible. This is achieved by running the inlet water first down one cold-rail 14a-14n then back the other cold-rail cooling the same set of in-line memory module 11a-11n. In this manner every DIMM attachment site to the two cold-rails has same average water temperature when both cold-rails water temperature is averaged. The heated exhaust water of the in-line memory module 11a-11n cold-rails 14a-14n is then used to cool components 28a-28n such as voltage transformation modules ("VTMs") and/or the like which are tolerant of higher water temperatures, after which the water exits to be cooled externally.

Figure 5:
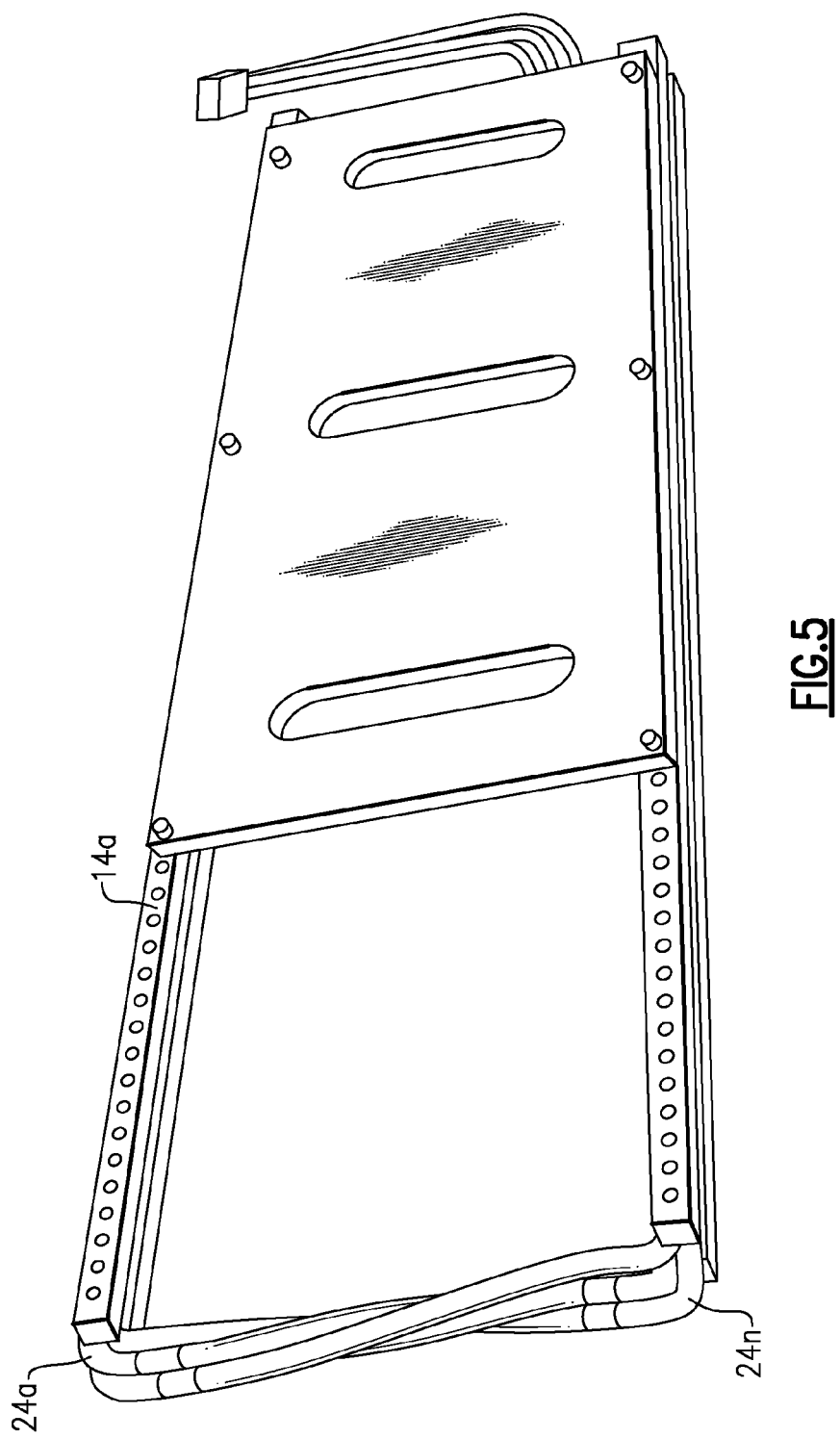
FIG. 5 is an illustration of a cold-rail with crossover tubes in accordance with the invention.

With additional reference to FIG. 5, a cold-rail 14a with four crossover tubes 24a-24n is shown. The four crossover tubes 24a-24n are twisted so that those tubes in the uppermost position on the inlet side cold-rails 14a-14n end up in the lower two positions on the exit side cold-rails. This enhances thermal performance as the water in the two upper position tubes 24a-24n is much warmer than in the lower positions because it is closer to the in-line memory module 11a-11n heat source. However by flipping the tubes 24a-24n, the second "return" cold-rail 14a-14n has the colder water starting in the upper position thus improving heat transfer.

Figure 7:
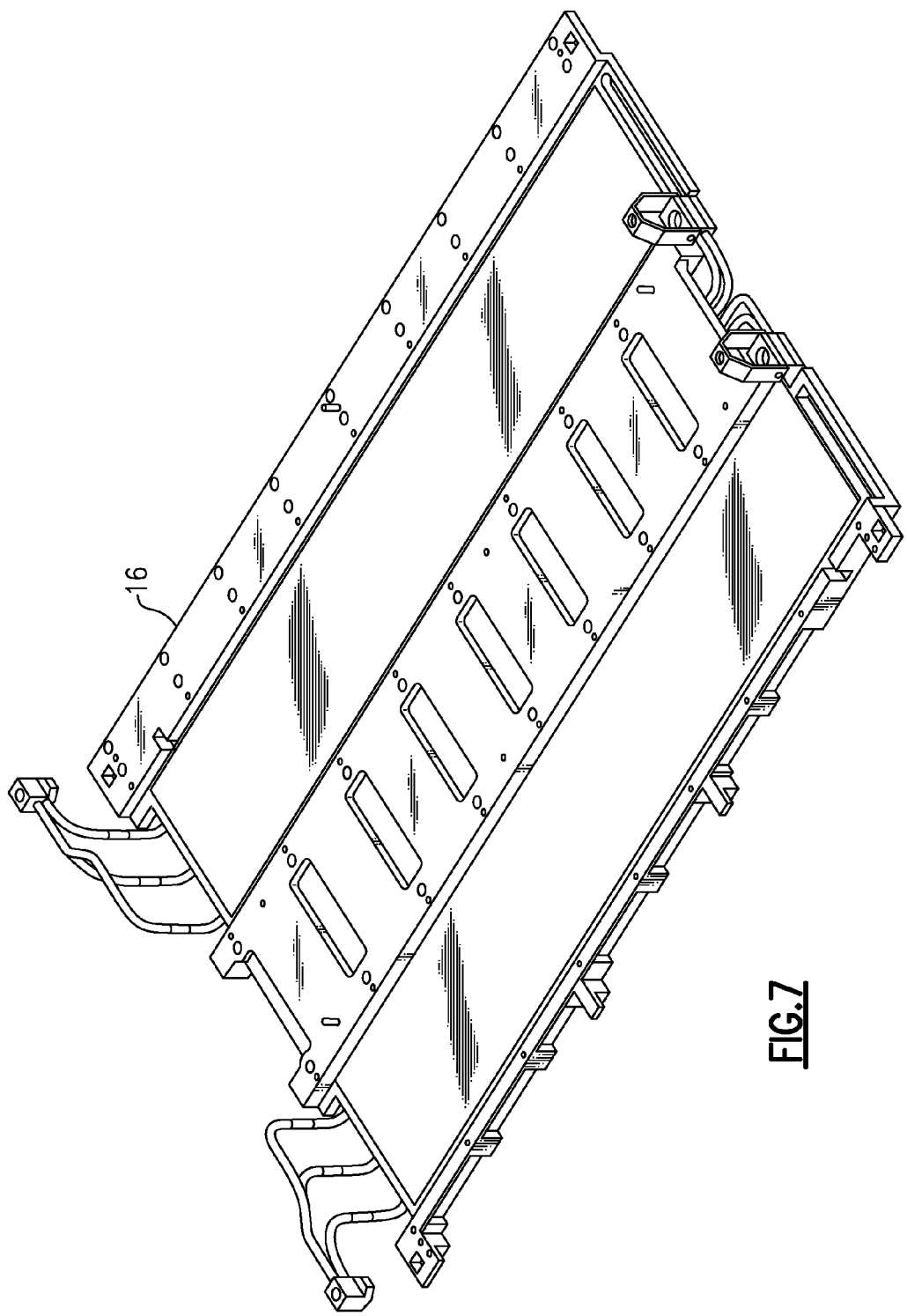
FIG. 7 illustrates the cold-plate of FIG. 1.

With additional reference to FIG. 7, which shows braze joints in copper machined construction. In an embodiment, the copper machined cold-rails 14a-14n have brazed joints and in-line memory module 11a-11n end conduction package with holes for screw 15a-15n attachment to the cold-rails.

Figure 6:
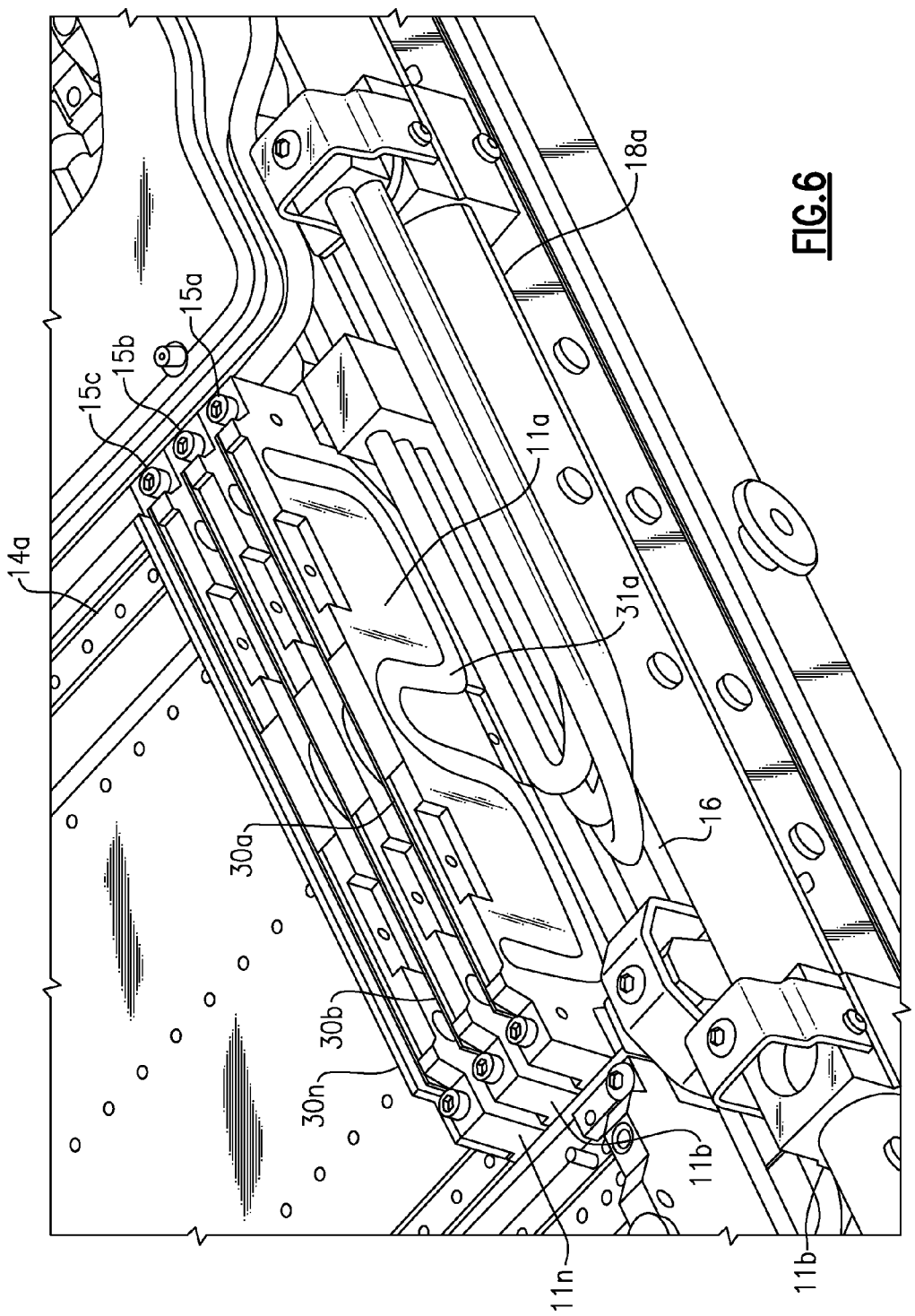
FIG. 6 illustrates in-line memory modules screwed to cold-rails as well as water feed from main manifold in accordance with the invention.

FIG. 6 shows the in-line memory modules 11a-11n screwed 15a-15n to cold-rails 14a-14n. In an embodiment, the copper machined cold-rails 14a-14n have brazed joints. In addition, FIG. 6 shows the water feed from main manifold to in-line memory module 11a-11n cold-rail 14a-14n using copper tubes. Heat dissipated across the memory modules 11a-11n is conducted to each end of the memory module assembly via conduction in aluminum or copper spreaders and with the help of heat pipes 31a-31n. The heat pipes 31a-31n use convection to transfer heat, much like a radiator. In another embodiment, the in-line memory module 11a-11n transfer heat from the memory DIMMs through conduction using, for example, a heat spreader 30a-30n (Al or Cu) and/or the like.

In an embodiment, the cold-rail 14a-14n remove heat from in-line memory module 11a-11n thermally and mechanically attached from above and from the printed circuit board 12 below. In another embodiment, the cold-rail 14a-14n assembly whose function is to remove heat from a series in-line memory modules 11a-11n where the heat of the DRAMs, ASICs, and other heat generating parts of the in-line memory module is conducted through appropriate TIMs into a conductive heat spreader 30a-30n on the front and one heat spreader on the back of the in-line memory module to transfer heat to each end of the in-line memory module. These heat spreaders 30a-30n are made of aluminum or copper and may include heat pipes 31a-31n or vapor chambers to facilitate heat transfer to the in-line memory module 11a-11n ends.

In an embodiment, a cold-rail 14a-14n that has a multitude of in-line memory modules 11a-11n attached to it through a screw 15a-15n connection at each end of the in-line memory module heatspreaders 30a-30n. The screw 15a-15 mates with appropriately spaced threaded holes in the cold-rails 14a-14n top side.

In an embodiment, the cold-plate 16 and/or cold-rail 14a-14n uses either a patterned Indium or an aluminized patterned Indium as the preferred thermal interface material between the in-line memory module 11a-11n spreader and the cold-plate thermal surface. The patterned Indium is attached to the DIMM spreader and is non-sticking to the colder cold-plate 16 as the aluminized side faces the cold-plate. This thermal path is validated prior to applying full power to the in-line memory module 11a-11n by monitoring thermal sensors located at hotspots within the in-line memory module assembly.

In an embodiment, the cold-plate 16 and/or cold-rail 14a-14n and in-line memory module 11a-11n assembly allows for easy removal and addition of in-line memory modules in the factory and in the customer location without moving the cold-plate or breaking any water connections. In another embodiment, the cold-plate 16 and/or cold-rail 14a-14n assembly enables the inlet water to proceed down one side of the in-line memory module 11a-11n and then cross over to a second leg of the cold-plate or cold-rail and proceed in the reverse direction with respect to where the water passes by each in-line memory module. In this manner each in-line memory module 11a-11n site is in a direct thermal conduction path with the same average water temperature by taking the average of the water at both ends of the in-line memory module thereby improving in-line memory module site temperature uniformity.

In an embodiment, the cold-plate 16 and/or cold-rail 14a-14n assembly is constructed of copper where the water passes in three parallel channels in each of two legs of the cold-plate assembly. This construction can be made by machining and brazing copper plates. In another embodiment, the cold-plate 16 assembly includes the two legs of the cold-plate as being interconnected in a means that mixes the water together as it is transferred from the upstream cold-rail 14a-14n to the downstream cold-rail.

In an embodiment, the cold-plate 16 and/or cold-rail 14a-14n assembly include the four copper tubes that are thermally and/or mechanically attached to the aluminum base section either with braze, solder or with a thermal epoxy. In another embodiment, the cold-plate 16 assembly includes the four copper tubes in each leg of the aluminum base cold-rail 14a-14n that are twisted in such a manner that the tubes that are in the upper half of the upstream cold-rail are brazed to the copper tubes in the lower half of the downstream cold-rail. This creates better overall in-line memory module 11a-11n cooling as more heat is removed from the in-line memory module than from the printed circuit board 12.

In an embodiment, the cold-plate 16 provides a circuit board 12 stiffener that is designed to cool Voltage Transformer Modules (VTMs) and similar power conversion devices that are soldered to the backside of a printed circuit board that has memory, processors, and other logic components on its front side. This cold-plate 16 acts as a circuit board stiffener 12 and conducts heat from where it contacts the printed circuit board to the water tubes in the cold-plate 16 of the assembly.

In an embodiment, the cold-plate 16 is constructed of high thermal conductivity aluminum with copper tubes carrying water running over the region of the board where the VTMs are located. These tubes are located on the side opposite of the thermal surface closest to the VTMs to enable special surface treatments of the aluminum thermal surface. In another embodiment, the cold-plate 16 has its thermal surface area directly above the VTMs roughened to between an N7 and N9 for long term stability of the TIM material to counteract when the printed circuit board 12 and the cold-plate expand and contract at different rates causing relative motion in the gap between the VTMs and the mating cold-plate surface.

In an embodiment, the cold-plate 16 uses a TIM material 26a-26n between the VTMs and the cold-plate thermal surface that has been suitably roughened. The TIM material 26a-26n will be of sufficient elasticity to allow for compression without harming the VTMs, such as a fully cured thermal gel. In another embodiment, the cold-plate is assembled to the printed circuit board 12 at a slow enough strain rate that the compression of the TIM material 26a-26n does not produce damaging stresses to the VTMs at worst case tolerances.

In an embodiment, the cold-plate 16 is designed to contact the backside of the printed circuit board 12 where VTMs are not located for purposes of providing board rigidity for plugging land grid array ("LGA") loaded modules and in-line memory modules 11a-11n. A suitable thin electrical insulator may be used as the interface between the printed circuit board 12 and the cold-plate 16. In another embodiment, the cold-plate 16 is designed to conduct heat from the printed circuit board 12 it is in mechanical contact with, especially in areas between the VTMs and processor modules where currents are highest in the board and associated resistance heating is high.

In an embodiment, the system 10 uses an inlet manifold feeding chilled water to multiple cold-rails 14a-14n for in-line memory module 11a-11n cooling. The outlet water from the in-line memory module 11a-11n cold-rails 14a-14n then feeds cold-plate 16 for cooling VTMs and similar devices that are located on the reverse side of the circuit board 12 from the in-line memory module and other logic components. The system 10 also includes an outlet manifold that connects tubes from the VTM cold-plate 16 outlet and returns the warmed water to be chilled outside of the drawer.

In an embodiment, the system 10 provides lower water temperature for cooling for the in-line memory modules 11a-11n, then uses the warmed exit water from in-line memory modules cooling to cool the less sensitive power components. In another embodiment, the cold-plate 16 assembly removes IIR resistive losses from both sides of the printed circuit board 12 enabling high board currents that cannot be air cooled.

In an embodiment, the system 10 provides an assembly that requires only one feed and one return manifold connection while cooling components on each side of printed circuit board 12. In another embodiment, the system 10 provides circuit board 12 rigidity for plugging and mechanically locates in-line memory modules 11a-11n at a proper height in the connectors 13a-13n.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   a cold-rail to engage each end of an in-line memory module adjacent where the in-line memory module is attachable to a circuit board, the cold-rail to remove heat from the in-line memory module; and
   a cold-plate connected to the cold-rail with the circuit board between the cold-plate and the cold-rail, the cold-plate to remove heat from the circuit board.

2. The system of claim 1 wherein the cold-rail and cold-plate each comprises an enclosed fluid pathway.

3. The system of claim 1 wherein the cold-rail is attachable to the circuit board to aid in removing heat from the circuit board.

4. The system of claim 1 wherein an upstream side of the cold-rail connects to a supply manifold, and one side of the cold-plate connects to a return manifold.

5. The system of claim 4 further comprising cross-over tubing between the upstream side of the cold-rail that connects to the supply manifold and the downstream side of the cold-rail that connects to the cold-plate to improve heat transfer out of the in-line memory module.

6. The system of claim 1 further comprising thermal interface material adjoining at least one of the cold-plate and components carried by the circuit board, and the cold-rail and the circuit board.

7. The system of claim 1 wherein the in-line memory module comprises a plurality of in-line memory modules that are too closely positioned for any intervening cold-rail or cold-plate to fit in between any two adjacent in-line memory modules.

8. The system of claim 1 wherein the in-line memory module has no space opposite the side that is attachable to the circuit board for any intervening cold-rail or cold-plate to be installed.

9. The system of claim 1 wherein the cold-rail engages each end of the in-line memory module with a removable fastener.

10. The system of claim 1 wherein the cold-plate acts as a circuit board stiffener.

11. A system comprising:
a cold-rail to engage each end of an in-line memory module adjacent where the in-line memory module is attachable to a circuit board, the cold-rail to remove heat from the in-line memory module, and the cold-rail engages each end of the in-line memory module with a removable fastener; and
a cold-plate connected to the cold-rail with the circuit board between the cold-plate and the cold-rail, the cold-plate to remove heat from the circuit board, and the cold-plate acts as a circuit board stiffener.

12. The system of claim 11 wherein the cold-rail and cold-plate each comprises an enclosed fluid pathway.

13. The system of claim 11 wherein the cold-rail is attachable to the circuit board to aid in removing heat from the circuit board.

14. The system of claim 11 wherein one side of the cold-rail connects to a supply manifold, another side of the cold-rail connects to one side of the cold-plate, and another side of the cold-plate connects to a return manifold.

15. The system of claim 14 further comprising cross-over tubing between the one side of the cold-rail that connects to the supply manifold and the other side of the cold-rail that connects to the cold-plate to improve heat transfer out of the in-line memory module.

16. The system of claim 11 further comprising thermal interface material adjoining at least one of the cold-plate and components carried by the circuit board, and the cold-rail and the circuit board.

17. The system of claim 11 wherein the in-line memory module comprises a plurality of in-line memory modules that are too closely positioned for any intervening cold-rail or cold-plate to fit in between any two adjacent in-line memory modules.

18. The system of claim 11 wherein the in-line memory module has no space opposite the side that is attachable to the circuit board for any intervening cold-rail or cold-plate to be installed.

19. A system comprising:
a cold-rail to engage each end of an in-line memory module adjacent where the in-line memory module is attachable to a circuit board, the cold-rail to remove heat from the in-line memory module, and the cold-rail comprises an enclosed fluid pathway;
a cold-plate connected to the cold-rail with the circuit board between the cold-plate and the cold-rail, the cold-plate to remove heat from the circuit board, and the cold-plate comprises an enclosed fluid pathway;
one side of the cold-rail connects to a supply manifold;
another side of the cold-rail connects to one side of the cold-plate; and
another side of the cold-plate connects to a return manifold.

20. The system of claim 19 further comprising cross-over tubing between the one side of the cold-rail that connects to the supply manifold and the other side of the cold-rail that connects to the cold-plate to improve heat transfer out of the in-line memory module.

21. The system of claim 19 wherein the cold-rail comprises an aluminum body relieved symmetrically on each side of the cold-rail to accept copper water tube and allow screw thermal-mechanical attachment to the circuit board and to in-line memory module spreaders.

22. The system of claim 19 wherein the cold-plate comprises a roughened finish to provide thermal interface material stability and durability during field use between the cold-plate and voltage transformer modules.

23. The system of claim 21 wherein the in-line memory module comprises aluminized Indium thermal interface material mechanically retained by the in-line memory module spreader prior to being plugged into the aluminum side faces of the cold-rail to prevent sticking after long use in field.

24. The system of claim 19 wherein the in-line memory module provides thermal and mechanical engagement of the in-line memory module and the thermal path to each respective cold-rail is validated by an in-line memory module thermal sensor readout during powering on of a server when the in-line memory module power levels are still low.

* * * * *